(12) United States Patent
Chen et al.

(10) Patent No.: US 10,224,481 B2
(45) Date of Patent: Mar. 5, 2019

(54) MECHANICAL FORMING OF RESISTIVE MEMORY DEVICES

(71) Applicant: The Trustees of the University of Pennsylvania, Philadelphia, PA (US)

(72) Inventors: I-Wei Chen, Swarthmore, PA (US); Yang Lu, Wynnewood, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 90 days.

(21) Appl. No.: 14/507,977

(22) Filed: Oct. 7, 2014

(65) Prior Publication Data

US 2016/0099410 A1 Apr. 7, 2016

(51) Int. Cl.
*H01L 45/00* (2006.01)
*G11C 13/00* (2006.01)

(52) U.S. Cl.
CPC ...... *H01L 45/1641* (2013.01); *G11C 13/0007* (2013.01); *G11C 13/0069* (2013.01); *H01L 45/10* (2013.01); *H01L 45/145* (2013.01); *H01L 45/146* (2013.01); *G11C 2013/0083* (2013.01); *G11C 2013/0095* (2013.01)

(58) Field of Classification Search
None
See application file for complete search history.

(56) References Cited

U.S. PATENT DOCUMENTS

| | | | |
|---|---|---|---|
| 3,886,577 A | 5/1975 | Buckley | |
| 3,905,435 A * | 9/1975 | Coronado | B60Q 1/22 116/28 R |
| 3,975,755 A | 8/1976 | Thornburg | |
| 4,296,406 A * | 10/1981 | Pearson | G01L 1/205 178/18.05 |
| 5,045,643 A * | 9/1991 | Miyabayashi | G06F 3/042 178/18.09 |
| 6,072,716 A * | 6/2000 | Jacobson | B82Y 10/00 257/E45.002 |
| 6,990,008 B2 | 1/2006 | Bednorz et al. | |
| 7,269,040 B2 | 9/2007 | Hu | |
| 8,399,881 B2 | 3/2013 | Yukawa et al. | |
| 2003/0162399 A1 | 8/2003 | Singh | |
| 2005/0202204 A1 | 9/2005 | Nishihara et al. | |
| 2005/0285497 A1 * | 12/2005 | Tamura | H01J 1/316 313/310 |
| 2006/0081911 A1 | 4/2006 | Batra et al. | |
| 2006/0189084 A1 | 8/2006 | Mizuguchi et al. | |
| 2006/0220055 A1 | 10/2006 | Erchak et al. | |

(Continued)

FOREIGN PATENT DOCUMENTS

WO WO 2013/151675 A1 10/2013

OTHER PUBLICATIONS

Polymer Morphology; http://plc.cwru.edu/tutorial/enhanced/files/polymers/orient/orient.htm; accessed Dec. 28, 2012; 3 pages.

(Continued)

*Primary Examiner* — Kimberly Rizkallah
*Assistant Examiner* — Bo Bin Jang
(74) *Attorney, Agent, or Firm* — Baker & Hostetler LLP

(57) ABSTRACT

Provided are methods of forming electric devices by effecting application of a stress to the device so as to deform the device within the device's elastic limit and to place the device into a new electric—e.g., resistance—state.

25 Claims, 5 Drawing Sheets

(56) References Cited

U.S. PATENT DOCUMENTS

| | | |
|---|---|---|
| 2006/0220551 A1 | 10/2006 | Yamazaki |
| 2007/0120124 A1 | 5/2007 | Chen et al. |
| 2007/0269683 A1 | 11/2007 | Chen |
| 2008/0192534 A1 | 8/2008 | Lung |
| 2008/0224229 A1 | 9/2008 | Tajima et al. |
| 2008/0315206 A1 | 12/2008 | Herner et al. |
| 2009/0173930 A1 | 7/2009 | Yasuda et al. |
| 2010/0037942 A1 | 2/2010 | Borland et al. |
| 2010/0149872 A1 | 6/2010 | Aoyagi |
| 2011/0156128 A1 | 6/2011 | Ono et al. |
| 2011/0210405 A1 | 9/2011 | Nakagawa et al. |
| 2011/0266512 A1 | 11/2011 | Chen et al. |
| 2012/0021612 A1 | 1/2012 | Nakagawa et al. |
| 2012/0043518 A1 | 2/2012 | Cheng et al. |
| 2012/0292584 A1 | 11/2012 | Rocklein et al. |
| 2014/0175356 A1 | 6/2014 | Wang et al. |
| 2014/0175357 A1 | 6/2014 | Nardi |
| 2016/0064664 A1 | 3/2016 | Dang et al. |

OTHER PUBLICATIONS

"Titanium Dioxide—Titania (Ti02)" by AZO Materials (http://www.azon.com/article.aspx?ArticleID=1179), date accessed Apr. 5, 2016, 3 pages.

"Electric Resistance" by The Physics Hypertextbook (http://physics.info/electric-resistance), date accessed Apr. 4, 2016, 6 pages.

\* cited by examiner

MECHANICAL FORMING OF RESISTIVE MEMORY DEVICES

GOVERNMENT RIGHTS

This invention was made with government support under Grant Numbers DMR-14-09114 and DMR-11-04530 awarded by the National Science Foundation. The government has certain rights in the invention.

TECHNICAL FIELD

The present disclosure relates to the field of resistive devices and to the field of manufacturing such devices.

BACKGROUND

Non-volatile resistance memory is a focus of memory research of electronic industry worldwide, and is regarded as a promising candidate for memory in future devices.

At present, resistive random-access memory (RRAM) devices require a comparatively large voltage to break the device down from a highly resistive initial state, in a so-called forming process, so as to enable subsequent resistance switching. Without the forming process, the device is essentially a bad insulator, and the device becomes an RRAM only after forming.

These electric forming processes, however, consume significant power and are usually very slow. In addition, electric forming creates conducting filaments, which are localized structures that undergo dielectric breakdown containing many defects of a wide variety, which are problematic. Further, electric forming results are highly dependent on the instrument and conditions used, as well as the device configurations and circuit characteristics. Without being bound to any particular theory, this is because the critical step in electrical forming is the nucleation of localized regions of dielectric breakdown under a huge transient current density, and such a dynamic process is difficult to reproducibly control in mass production.

Because of this challenging process, there is currently a barrier to uniform and reliable RRAM devices. Accordingly, there is a need for improved forming processes for electrical devices.

SUMMARY

In meeting the described challenges, the present disclosure first provides methods of forming a resistive device, the methods comprising effecting application of a stress to a resistive device having a switching layer, the stress being such that the device is deformed within the device's elastic limit, and the stress being applied so as to change a resistance of the device so as to place the device into a first new resistance state.

The present disclosure also provides methods of forming an electric device, the methods comprising effecting application of a stress to a device having an insulator layer, the stress being such that the device is deformed within the device's elastic limit the stress being applied so as to place the device into a new electric state.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

Figure 1:
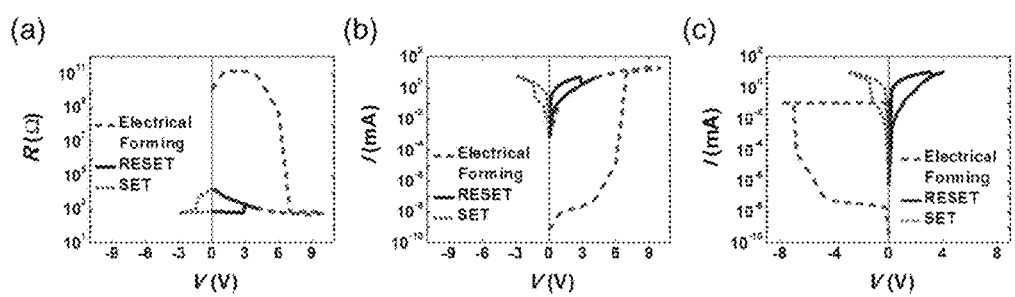
FIG. 1 shows typical I-V and R-V curves of one embodiment of the memory devices suitable for pressure forming and switching, using $HfO_x$, with the combination of Ti bottom and Pt top electrodes. The dashed curves correspond to the electrical forming process, followed by RESET (from low resistance state or LRS to high resistance state HRS) in solid curves or SET (from high resistance state to low resistance state) in dotted curves in various orders. (a) The virgin device was extremely resistive, but can be formed by a positive voltage to HRS, followed by SET, then RESET. (b) Same as (a), replotted as I-V curves. (c) Forming of a virgin device by a negative voltage to LRS, followed by RESET, then SET.

The present invention can be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, can also be provided in combination in a single embodiment. Conversely, various features of the invention that are, for brevity, described in the context of a single embodiment, can also be provided separately or in any subcombination. Further, reference to values stated in ranges includes each and every value within that range. Any documents cited herein are incorporated herein by reference in their entireties for any and all purposes.

Provided here is a technology that teaches the use of stress application (e.g., via an external force or pressure) as a method to render non-volatile resistance switching memory devices. In practice, it can be adopted as a scaled manufacturing process, for example, as a short-time pressure treatment of many memory device assemblies inside a pressure vessel or a stamping operation of an individual device assembly by a punch. Information in the field of resistance switching memory does not suggest that a pressure or force can switch a device, in particular, to switch a device from the extremely resistive virgin state to a highly conducting low resistance state. The common practice until now is to apply a large electrical field to the device in a so-called forming process, but this process may create damage that renders devices less reliable and with scattered or inconsistent features.

By contrast, pressure forming is a desirable and efficient manufacturing process. Because many devices can be fitted into one pressure vessel, and the time for pressure treatment can be short (e.g., only several minutes), the throughput can be high. No heating or electrical current is required. The method is applicable to any devices that involve an electron trapping mechanism. Further, because most resistance random access memories (RRAM or ReRAM) today operate on an ionic or atomic migration mechanism and not on electron trapping, it is entirely unexpected that they can be pressure formed, making this discovery of simple and general method extraordinary. The technology is of interest to the electronic memory industry, as it offers new opportunities and flexibilities for design, processing, and fabrication of RRAM/ReRAM.

In one embodiment, the present disclosure provides methods of forming resistive devices. The methods suitably include effecting application of a stress to a resistive device having a switching layer. The stress may be applied such that the device is deformed within the device's elastic limit. As described elsewhere herein, the stress is suitably applied so as to change a resistance of the device so as to place the device into a first new resistance state.

Although a mechanical force or stress can be used to alter a material or a device, changes of electrical properties are typically small as long as the material or device is not typically deformed beyond the elastic limit or causing fracture. The elastic limit is the value of force or stress that does not cause a permanent change (i.e., plastic deformation) in the overall size and shape of the object, i.e., the change remaining after the force or stress, distal one and local one, is removed. Fracture refers to formation of any crack, including internal cracks that may or may not have caused overall separation of the object into two or more parts. Plastic deformation occurs when the deviatoric stress tensor component exceeds its elastic limit. Therefore, a uniform pressure which has no deviatoric stress-tensor component, unlike other stresses caused by stretching, pushing, bending, twisting, etc., and, as such, cannot cause any plastic deformation.

Accordingly, elastic deformation in general and pressure deformation in particular are typically reversible (or nearly so) insofar as shape and physical dimension are concerned, and the percentage change in electrical property such as resistance is also small, typically being of the same order of the percentage change of the dimensions (length and area) of the object. Because the elastic limit is typically of the order of one to three percent in terms of dimensional change, the corresponding electrical resistance change is likewise small—e.g., up to only a few percent. Moreover, it is mostly recoverable once the stress is removed at that same time when the shape is recovered. It should be understood that the pressure applied to a device according to the present disclosure may be a uniform pressure, but uniform pressure is not a requirement. A non-uniform pressure (e.g., a pressure that is greater at one location on the device than at another location) is also suitable.

Thus, the discovery provided herein that device resistance can be lowered by several (e.g., 2, 3, 4, 5, 6, or 7) orders of magnitude, e.g., from more than 1 G$\Omega$ to less than 1000$\Omega$, by a pressure that caused an estimated change of volume of well less than 1%, is most unexpected.

In some embodiments, the stress is applied so as to lower the resistance of the device. The reduction may be a factor of 2, 10, 100, 1000, or greater. The stress may be applied so as to reduce a resistance of the device by from about 1 to about 7 or even about 8 or 9 orders of magnitude, or by from about 2 to about 6 orders of magnitude, or from about 3 to about 5 orders of magnitude. The disclosed methods may be applied to a variety of devices, including, e.g., memory devices.

The stress may be applied so as to reduce the volume of the device, e.g., by about 3%, by about 2%, or even by about 1% or less. As described elsewhere herein, the stress is suitably applied to reduce the volume by about 1% or less.

A user may apply stress via a fluid (including liquids and gases) or even by a mechanical element. Suitable fluids include oils, water, and the like. A device may be placed in a bag or other enclosure so as to allow for application of pressure while also minimizing or eliminating exposure of the device to the liquid.

Pressure vessels and the like may be used; in one embodiment, a user may place one, two, or more devices into a pressure vessel and then apply a pressure so as to condition multiple devices at the same time. In this way, a user may condition many devices in parallel all at the same time. Thus, the pressure forming technology disclosed here is suitable for mass production.

In practice, one may apply a pressure or mechanical force to adjust the resistance value, capable of changing the resistance from, in some cases, 10 G$\Omega$ to 1 k$\Omega$, i.e., a reduction of 7 orders of magnitude. After pressure forming, the formed memory devices have the same switching behavior as that of devices formed according to traditional electric forming processes.

Further, because a pressure vessel can accept many devices at the same time and the pressure inside the vessel is uniform, pressure forming is a massively parallel manufacturing process of extraordinary uniformity. Therefore, this technology provides reduced power consumption, higher throughput, better product uniformity, and fewer product defects.

A device used in the disclosed methods may, as described, has a switching layer. The switching layer may have a thickness in the range of from about 1 nm to about 100 nm, or in the range of from about 5 to about 90 nm, or from about 10 to about 75 nm, or even about 50 nm. The switching layer is suitably a material that may maintain two or more resistive states, after forming, even though the unformed layer may be very resistive and may not maintain more than one resistive state.

Switching layers may include any standard RRAM/ReRAM material, including but not limited to $HfO_x$, $ZrO_x$, $TiO_x$, $TaO_x$, $NbO_x$, $NiO_x$, $ZnO_x$, $CuO_x$, $ScO_x$, $YO_x$, $GdO_x$, $AlO_x$, $SiO_x$, $SiN_x$, $AlN_x$. Typically, the material is highly resistive prior to forming, although this is not a requirement.

Devices may also include an insulating layer that contacts the switching layer. The insulating layer may suitably have a thickness in the range of at least about 0.5 nm, e.g., about 1 nm, about 2 nm, about 3 nm, about 4 nm, about 5 nm, about 10 nm, about 20 nm, or any value there between. An insulating layer may comprise, e.g., $SiO_x$, $AlO_x$, $HfO_x$, and the like; insulator materials will be known to those of ordinary skill in the art.

It should be understood that devices may include one, two, three, or more switching layers. Devices may also include one, two, three, or more insulator layers. Switching layers may differ from one another in terms of dimension and/or composition, and insulator layers may also differ from one another in terms of dimension and/or composition.

A resistance device may suitably include one or more electrodes. The device may include an electrode in electronic communication with the switching layer, directly or through one or more insulating layers. It is not necessary that the electrode be in physical contact with the switching layer, although such a configuration is considered suitable.

As described, application of the stress may change a resistance or other electric state of the device. A user may also apply a voltage so as to change a resistance of the device so as to place the device into a second new resistance state.

As shown in the appended examples, the present disclosure provides devices that are stable over time. The resistance device following stress application may be capable of maintaining a resistance value within about 10% or less of the first new resistance for about 10 minutes, for about 1 hour, for about 1 day, for 1 week, for 5 weeks, for 50 weeks, for 100 weeks, or even for 1, 2, 5, or 10 years. Following stress application, the device may be capable of maintaining a resistance value within about 5% or less of the first new resistance for about 10 minutes, for about 1 hour, for about 1 day, for 1 week, for 5 weeks, for 50 weeks, for 100 weeks, or even for 1, 2, 5, or 10 years.

A variety of stresses may be used in the disclosed methods. Pressure is considered an especially suitable treatment, but all stresses—e.g., tensile, axial, shear, torsional, bending—are suitable. A suitable pressure may be less than about 15 GPa, less than about 10 GPa, less than about 5 GPa, less than about 2 GPa, or even less than about 1 GPa.

In some embodiments, a device may comprise a material having a pre-existing stress. In these configurations, effecting application of the stress comprises altering at least some of the pre-existing stress of the material. The altering may, e.g., be effected by releasing at least some of the pre-existing stress of the material. Altering may also be effected by removing at least some of the material, by heating, by chemical treatment, by sonication, by illumination, by photocuring, or by any combination thereof.

The present disclosure also provides methods of forming an electric device. The methods comprise effecting application of a stress to a device having an insulator layer, the stress being such that the device is deformed within the device's elastic limit, and the stress being applied so as to place the device into a new electric state. It should be understood that the disclosed methods are applicable to a variety of devices, including but not limited to transistors, FETs, capacitor memory devices (like DRAM), floating gate memory (e.g., flash memory used in smart phones and the like).

The disclosed methods are particularly suitable to electric devices that may implicate trapped charge, as trapped charge may be removed by the disclosed methods. Without being bound to any particular theory, charge may be trapped in an insulator layer or in a conductor layer surrounded by an insulator layer. Accordingly, a user may apply the stress so as to lower the amount of trapped charge of the device.

As trapped charge may be unintentionally introduced during device fabrication, it is usually difficult to detect; and even if it is detected, trapped charge is usually difficult to remove. The disclosed methods are particularly suitable to devices that contain unintentionally introduced trapped charge. Without being bound to any particular theory, trapped charge may cause degradation, decrease reliability, increase performance variability, of devices. The disclosed methods are particularly valuable to devices that suffer from such trapped-charge-related problems.

As described elsewhere herein, the stress may be applied so as to lower the resistance of the electric device. Also as described elsewhere herein, the electric device may be a memory device.

Stress application may reduce the volume of the electric device by less than about 3%, by less than 2%, or even by less than 1%. The stress may be applied so as to reduce a resistance of the device by from about 1 to about 7 orders of magnitude, also as described elsewhere herein.

Stress may be applied by a fluid, by a mechanical element, or both. Suitable fluids are described elsewhere herein. Suitable mechanical elements include punches, pins, pistons, presses, vices, clamps, and the like.

Electric devices in the disclosed methods may include a first insulator layer (sometimes called a resistive layer) having a thickness in the range of from about 1 nm to about 100 nm, or in the range of from about 5 to about 90 nm, or from about 10 to about 75 nm, or even about 50 nm.

The electric device may also include a second insulator layer, or a conductor or a semiconductor layer, or both, that contacts the first resistive (alternatively termed insulator, in some cases) layer. The second insulator layer, or a conductor or a semiconductor layer, or both, may have a thickness in the range of at least about 0.5 nm, e.g., about 1 nm, about 2 nm, about 3 nm, about 4 nm, about 5 nm, about 10 nm, about 20 nm, or any value there between. First and second (and additional) insulator layers, or a conductor or a semiconductor layer, or both, may differ from one another in dimension and/or composition.

A user may also apply a voltage so as to place the electric device into a second new electric state. The voltage may be applied to perform a FET operation or like process, and is not necessarily limited to changing the resistance of the device.

It is not a requirement that an electric device conditioned according to the disclosed technology be non-volatile. Examples of such technology include, but are not limited to transistors, FETs and capacitor memory devices (like DRAM).

The device following stress application may be capable of maintaining an electronic value (e.g., resistance) within about 10% of an electric value of the device following stress application for about 10 minutes, for about 1 hour, for about 1 day, for 1 week, for 5 weeks, for 50 weeks, for 100 weeks, or even for 1, 2, 5, or 10 years. Examples of such technology include, but are not limited to RRAM or ReRAM, and floating gate memory such as flash memory.

Following stress application, the device may be capable of maintaining an electronic value (e.g., resistance) within about 5% of an electric value of the device following stress application for about 10 minutes, for about 1 hour, for about 1 day, for 1 week, for 5 weeks, for 50 weeks, for 100 weeks, or even for 1, 2, 5, or 10 years.

As described elsewhere herein, devices may include one or more electrodes. An electrode suitably comprises a metal, e.g., Cu, Mo, Pt, and the like. Pt, Pd, Ni, W, Au, Ag, Cu, Al, Rh, Re, Ir, Os, Ru, Nb, Ti, Zr, Hf, V, Ta, Cr, Mo, Mn, Tc, Fe, Co, Zn, Ga, In, Cd, Hg, Tl, Sn, Pb, Sb, Bi, Be, Mg, Ca, Sr, Ba, Li, Na, K, Rb, or Cs, a nitride $MeN_x$ including TiN, ZrN, HfN, NbN or TaN, a silicide $MeSi_x$ including $PtSi_2$, $TiSi_2$, $CoSi_2$, $NiSi_2$, $NbSi_2$, $TaSi_2$, $MoSi_2$ or $WSi_2$ are all considered suitable electrode materials. Devices suitably include two or more electrodes in some embodiments.

Suitable stresses are described elsewhere herein, and include pressure, tensile, axial, shear, torsional, and bending stresses. A suitable pressure may be less than about 15 GPa, less than about 10 GPa, less than about 10 GPa, less than about 2 GPa, or even less than about 1 GPa.

In some embodiments, an electric device may comprise a material having a pre-existing stress. In these configurations, effecting application of the stress comprises altering at least some of the pre-existing stress of the material. The altering may, e.g., be effected by releasing at least some of the pre-existing stress of the material. Altering may also be effected by removing at least some of the material, by heating, by chemical treatment, by sonication, by illumination, by photocuring, or by any combination thereof.

Additional Disclosure

The following non-limiting disclosure provides further discussion of the disclosed technology.

(1) A resistance-switching memory device suitable for pressure forming and switching was fabricated on a substrate of thermal-oxide-coated single crystal n-type or p-type silicon with 100 or 111 orientations. It used polycrystalline Mo or Ti as the bottom electrode, Pt as the top electrode, and $HfO_x$ (or other appropriate dielectric or insulating material) as the middle layer, forming a metal-insulator-metal (MIM) structure. Layers can be deposited on a heated or unheated substrate; on an unheated substrate, the deposited electrodes may be polycrystalline. The insulator may be polycrystalline or amorphous. Exemplary test cells had a diameter of ~100 microns ("μm"), although this size is not limiting. For purposes of illustration, the dielectric or insulating layer is referred to as the switching layer hereafter because its resistance can undergo relatively large changes, following additional conditioning, called forming.

(2) The Pt top electrode described above in (1) provides superior scratch resistance and is thus convenient for laboratory electrical testing using a test probe, but other common electrodes can also be used. The Mo or Ti bottom electrode in (1) provided a smooth sputtered interface, thus it is convenient for subsequent mixture layer deposition, but other common electrodes can also be used. Common electrodes include but are not limited to Mo, W, Cu, Ta, TaN and TiN.

(3) A bottom electrode was deposited by DC-sputtering. Film thickness, orientation and crystallinity were determined by a theta-2 theta diffractometer and a four circle x-ray diffractometer, both using a Cu Kα source. Surface morphology was observed by atomic force microscopy.

(4) Atomic layer deposition (ALD) was used to deposit $HfO_x$. RF-sputtering and other suitable deposition techniques can also be used to deposit $HfO_x$ or other kinds of switching layers. Electrical properties were measured using several electrical meters on a Signatone S-1160 probe station. Current-voltage (I-V) and resistance-voltage (R-V) curves were measured in continuous voltage-sweep modes. The resistance is defined as the ratio of V/I. As used in the following tests, positive bias is the one causing a current to flow from the top electrode to the bottom electrode. Several sets of room temperature R-V and I-V curves of a device with a resistance-switching layer of $HfO_x$ and Pt/Ti top/bottom electrodes as shown in FIG. 1. They can be converted from one to the other, as FIG. 1(b) is converted from FIG. 1(a).

(5) The resultant, so-called virgin structure had a very large initial resistance of ~10 GΩ, see FIG. 1(a). Using a positive forming voltage of about 7 V, it was formed (dashed curve in FIG. 1(a)) into a lower resistance condition ending at about 10 kΩ which turned out to be a high resistance state (HRS), i.e., the off-state. After forming, the device could be switched from HRS to a low resistance state (LRS, i.e., the on-state) of about 1000Ω or 10 kΩ by a negative switching voltage of about −1 V; this is called SET or on switching, as represented by the dotted curve in FIG. 1(a). After that, it could be returned to the HRS by a positive switching voltage of about +2.5 V; this is called RESET or off switching, as represented by the solid curve in FIG. 1(a). In this way, after electrical forming, the device can be repeatedly switched between LRS and HRS at will. The same results are plotted in FIG. 1(b) as I-V curves.

As shown in FIG. 1(c), initial forming could also be performed using a negative forming voltage of about −7 V. To do so successfully, however, a current compliance was used to limit the maximum current passing through the device. Without being bound to any theory, this is because negative forming resulted in the LRS instead of the HRS, so the current, if not limited by the compliance, can be extremely large, causing damage to the film.

As shown in FIG. 1(c), after forming at a voltage of about −7 V, the LRS could be RESET to the HRS by a positive switching voltage of about +2.5 V, then the HRS could be SET to the LRS by a negative switching voltage of about −1 V. Subsequent switching between the HRS and LRS could be repeated many times, and no difference between negative-voltage electrical forming and positive-voltage electrical forming was apparent anymore.

(6) The HRS is non-linear (non-Ohmic) with a resistance value that decreases with voltage. The HRS is maintained at zero voltage indicating the off-state memory is non-volatile: this zero-voltage resistance is typically higher than 10 kΩ. The HRS can be maintained between a negative bias of about −1.0 to −1.5 V and a very large positive bias without failure. The LRS is also maintained at zero voltage indicating the on-state memory is also non-volatile. The on-off ratio of the resistance at zero voltage typically exceeds 10:1. The LRS can be maintained up to a positive bias of about 2.5 V and a very large negative bias without failure. The device thus allows a read voltage between −0.5 V and +1 V without disturbing the high and low resistance states. The device could be read repeatedly and showed little change in memory of either high or low resistance.

Figure 2:
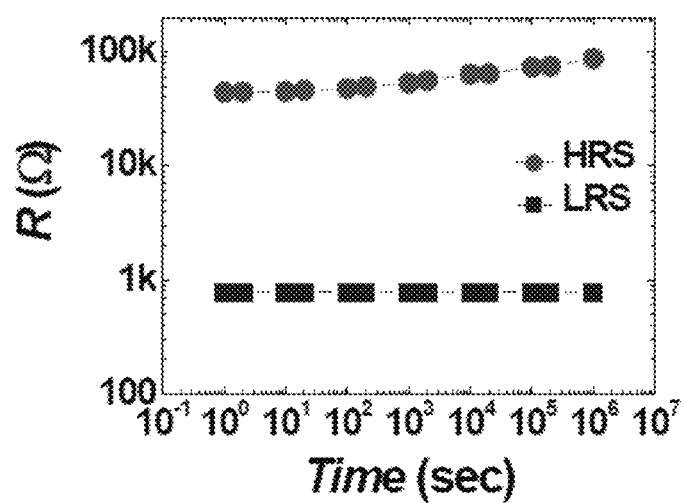
FIG. 2 demonstrates data retention of one embodiment of the memory devices suitable for pressure forming and switching using $HfO_x$, with the combination of Ti and Pt electrodes. Both HRS and LRS values can be held for more than 10 days without any obvious degradation.

(7) The resistance states can be kept in a non-volatile manner as verified by certain retention experiments. Generally, there is no need for an electrical source to maintain the resistance states. One example is shown in FIG. 2. Data retention of HRS and LRS was tested using electrical read operations at 0.2 V after certain time period. As shown in FIG. 2, no obvious degradations were observed up to 10 days, indicating each state is stable and non-volatile for data storage.

(8) Other filamentary RRAM are also suitable for pressure forming These RRAM can be made of any oxide, nitride, oxynitride, or any insulators, with or without dopants or second phases. The RRAM active layer can be crystalline, or amorphous, or a mixture of crystalline and amorphous phases.

(9) Common examples of filamentary RRAM use $HfO_x$, $TiO_x$, $TaO_x$, $NiO_x$, or $SrZrO_3$, for active layers. However, many other possibilities also exist, and the pressure forming method is applicable to them all. Such active layers can be deposited by any number of methods, including sputtering, CVD, PVD, pulse laser deposition, atomic layer deposition, and other common and specialized techniques. Electrodes can be made of metals or conducting oxides, nitrides, carbides, silicides, and doped silicon, and can be of the same type or different types for the top and bottom electrodes. Additional layers between the active layer and the electrodes can also be inserted.

Exemplary Methods of Applying Pressure

Pressure can be applied in a number of ways. The pressure can be a fluid pressure or a gas pressure. The pressure fluid can be aqueous or non-aqueous, either volatile or non-volatile, at ambient pressure, with the only requirement that it should not solidify under a pressure. A gas pressure is convenient since no drying is needed after the pressure treatment. Just like a pressure fluid, the gas can be mostly recovered and recycled.

High pressure can be achieved inside a pressure vessel by a number of ways. For example, an intensifier which operates on gas pumps may be used. This method is applicable for both gas pressure and fluid pressure. When a fluid medium is used, it is also possible to use a mechanical piston that directly compresses the pressure fluid.

A suitable size of the pressure vessel is selected based on the need of manufacturing. A faster throughput is made possible by a larger vessel, which can accept more devices.

As an alternative to pressure, a uni-directional mechanical force can be used to apply a compressive stress to the device to achieve forming Such a compressive force can be applied by a tip, a punch or a ram, of a variety of areas. The compressive pressure can be applied to one device at a time, or many devices at a time. Both a static force and a dynamic force, such as an ultrasonic force, can be used.

As another alternative to pressure, a pre-existing stress may be built in to a device, then altered subsequently. The altering may, e.g., be effected by releasing at least some of the pre-existing stress of the material. Altering may also be effected by removing at least some of the material, by heating, by chemical treatment, by sonication, by illumination, by photocuring, or by any combination thereof. The pre-existing stress may be concentrated in a stress layer in the device.

The method of mechanical forming by pressure or unidirectional force can be combined with an electrical signal such as voltage or current, applied either before pressure forming, simultaneously with pressure forming, or after pressure forming

ILLUSTRATIVE EXAMPLES

The effect of a uniform pressure on three different resistance states (HRS, LRS and the virgin state) was examined for the same $HfO_x$ memory device as shown in the attached figures. Before applying pressure, memory devices were mounted on a metal plate with silver paste, covered by an aluminum foil, sealed inside an elastomer (rubber-like) bag which was next evacuated, then the evacuated bag with its content was next placed inside a pressure vessel. The pressure was next applied to reach the desired pressure value, and held there for 5 minutes. The system applies a pressure of about 1 GPa (though other pressures are attainable; the 1 GPa value is non-limiting), using oil as working fluid, which effects an isotropic (or nearly isotropic) uniform compressive stress in every direction on the sample, thus avoiding tensile or shear deformation, causing cracking and other anisotropic damage. After about 5 minutes, the pressure was released and the devices removed and electrically tested. It should be understood that the 5 minute pressure application is illustrative only, as a stress (e.g., pressure) may be applied for from 0.01 seconds to about 10, 20, 30, 50 or 100 hours, from about 1 second to about 30 minutes, from about 10 seconds to about 10 minutes, or from about 2 minutes to about 5 minutes.

Example 1

The first device was electrically formed to the HRS using a positive forming voltage. After a pressure was applied, the HRS became the LRS; this LRS could be electrically RESET to the HRS. Thus, there is a pressure effect on the HRS, but there is no apparent damage caused by the pressure other than switching the HRS to the LRS.

Example 2

The second device was also electrically formed to the HRS using a positive forming voltage. Next, it was SET by a negatively voltage to the LRS. After a pressure was applied, the LRS remained at the LRS; this LRS could be electrically RESET to the HRS. Thus, there is no pressure effect on the LRS, and there is no apparent damage caused by the pressure.

Example 3

Figure 3:
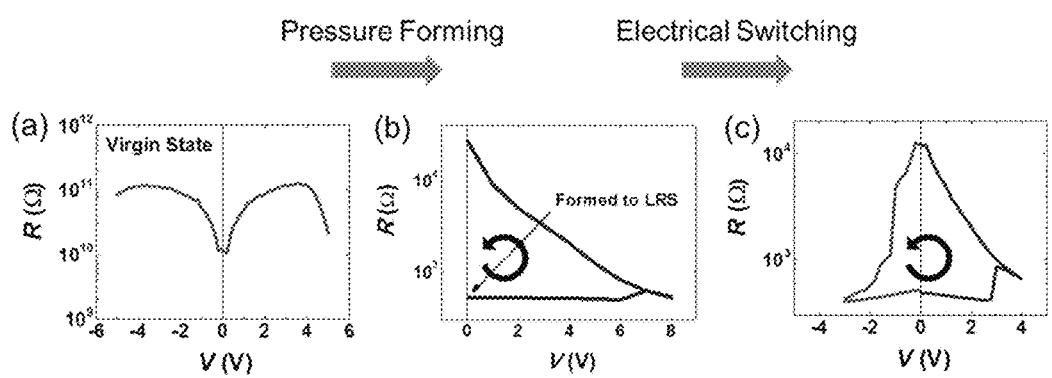
FIG. 3 shows the pressure effect on a virgin $HfO_x$ memory. (a) The virgin device was extremely resistive. (b) After the pressure treatment, the device was formed to the LRS. (c) The LRS was subsequently RESET to the HRS by a positive switching voltage. Circle next to the R-V curve indicates direction of switching.

The third device was a virgin device, never tested before. As shown in FIG. 3(*a*), the initial device was highly resistive with a resistance value more than about 10 GΩ. After the pressure treatment, shown in FIG. 3(*b*), the device had a resistance of about 500Ω corresponding to the LRS. This LRS could be electrically RESET to the HRS, then SET to the LRS, as shown in FIG. 3(*c*). Thus, pressure can be used to form a virgin device to the LRS, and there is no apparent damage caused by the pressure.

Example 4

Figure 4:
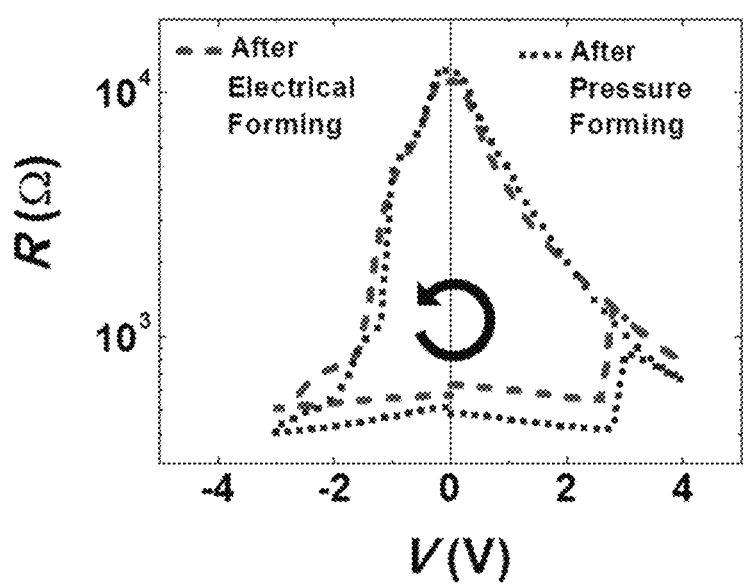
FIG. 4 compares the R-V curves of two devices, one formed by an electrical voltage, the other formed by pressure. After forming, the two subsequent switching curves are almost identical, demonstrating that pressure forming does not cause more damage than electrical forming. Circle indicates direction of switching.

As further evidence that pressure does not cause harm to the device other than causing forming or causing the HRS to switch to the LRS, when one compares the switching curves of an electrically formed device, before and after a subsequent pressure treatment, the two switching curves are almost identical despite the pressure, which caused switching from the HRS to the LRS. Likewise, when one compares the switching curves of two devices, one formed by electrical voltage, the other formed by pressure, the two switching curves are almost identical, as illustrated in FIG. 4.

Example 5

Figure 5:
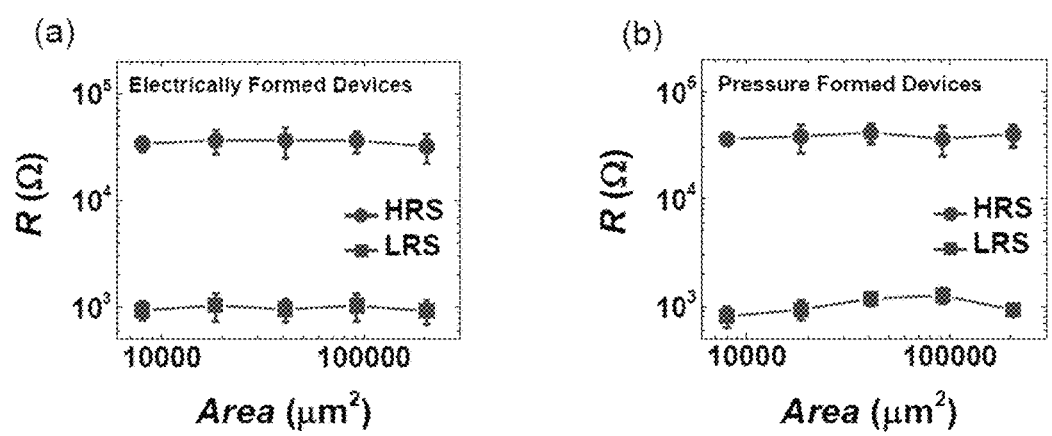
FIG. 5 compares the resistance values of devices formed electrically (a) and by pressure (b). The devices have various sizes as defined by the top electrode areas. For both forming methods, area independency was observed for resistance values of HRS and LRS; the two sets of values are the same regardless of the forming methods.

To compare the device switching performance after pressure-forming and electrical forming, one may assess the resistance values in the two types of devices. The electrically formed HfO$_x$ memory devices of different electrode sizes were found to have a nearly constant HRS resistance value and a nearly constant LRS resistance independent of the electrode area (FIG. 5(a)). The same behavior was found in the pressure formed devices (FIG. 5(b)). Here each data point was the average of more than 5 different cells. Note that not only the area independency is the same in FIG. 5(a) and FIG. 5(b), but also the values of each state are almost identical. Therefore, pressure forming produced essentially the same resistance switching memory devices as electrical forming Non-limiting Principle of Operation Without being bound by theory, the following is provided to explain the principle of operation of pressure forming.

The observation that a pressure can cause a huge reduction of resistance is indicative of a pressure-induced insulator-to-metal transition. But because the pressure used is below the elastic limit, not causing any massive structural changes, this transition may be due to small local changes.

The change may be explained by electron-phonon-interaction since pressure can cause local bond distortion in highly disordered material, which triggers the interaction destabilizing electrons. The results suggest that the filamentary RRAM contains trapped electrons that can be destabilized by bond distortion. In the initial, as-fabricated state, the concentration of trapped electrons is high. These trapped electrons can block their surrounding regions making the passage of itinerant electrons difficult, thus causing a very high initial resistance exceeding 10 GΩ to be present.

In the HRS, less but still considerable trapped electrons are present, so the resistance is also lower, of the order of 10 kΩ. In the LRS, very few trapped electrons are present, so the resistance is the lowest.

As pressure destabilizes trapped electrons, the trapped electrons escape and the resistance drops to the value of the LRS. Conversely, the LRS, having few or no trapped electrons, is insensitive to pressure. Therefore, a pressure can cause the initial state and the HRS to switch to the LRS, but has minimal effect on LRS. The disclosed methods can thus be used to condition the resistance of any trapped electron memory devices, lowering their resistance values.

Trapped charge unintentionally introduced during device fabrication may also be stabilized by certain bonding in the insulator layers or their interfaces in the device. Since pressure can cause local bond distortion in disordered material, it can trigger the electron-phonon interaction destabilizing trapped electrons. Therefore, a pressure can remove trapped charge left in the device during device fabrication. The disclosed method can thus be used in electric devices other than RRAM to condition their concentration of trapped charge.

What is claimed:

1. A method of forming an altered resistive device from a base device, the method comprising:
    effecting application of a physical pressure to the base device having a switching layer, the base device having a resting resistance value that is a base resting resistance value,
    the physical pressure being such that the base device is deformed within the base device's elastic limit,
    the physical pressure being applied so as to change the resting resistance value of the base device from the base resting resistance value to a persistent altered resting resistance value and so as to give rise to the altered resistive device having the persistent altered resting resistance value following release of the physical pressure.

2. The method of claim 1, wherein the physical pressure is applied such that the altered resting resistance value is lower than the base resting resistance value.

3. The method of claim 2, wherein the physical pressure is applied such that the altered resting resistance value is from about 1 to about 7 orders of magnitude smaller than the base resting resistance value.

4. The method of claim 3, wherein the physical pressure is applied such that the altered resting resistance value is from about 2 to about 6 orders of magnitude smaller than the base resting resistance value.

5. The method of claim 2, wherein the physical pressure is applied so as to reduce the base resting resistance value of the base device by from about 3 to about 5 orders of magnitude.

6. The method of claim 1, wherein the altered resistive device is a memory device.

7. The method of claim 1, wherein applying the physical pressure reduces the volume of the base device by less than about 3%.

8. The method of claim 7, wherein applying the physical pressure reduces the volume of the base device by less than about 2%.

9. The method of claim 8, wherein applying the physical pressure reduces the volume of the base device by less than about 1%.

10. The method of claim 1, wherein the physical pressure is applied by a fluid.

11. The method of claim 1, wherein the switching layer has a thickness in the range of from about 1 nm to about 100 nm.

12. The method of claim 11, wherein the base device further comprises an insulating layer contacting the switching layer.

13. The method of claim 12, wherein the insulating layer has a thickness in the range of at least about 0.5 nm.

14. The method of claim 1, wherein the altered resistive device, following the physical pressure application, is capable of maintaining a resting resistance value within about 10% of the altered resting resistance value for about 10 minutes.

15. The method of claim 1, wherein the altered resistive device, following the physical pressure application, is capable of maintaining a resting resistance value within about 5% of the altered resting resistance value for about 10 minutes.

16. The method of claim 1, wherein the altered resistive device comprises an electrode in electronic communication with the switching layer.

17. The method of claim 1, wherein the physical pressure is less than about 2 GPa.

18. The method of claim 17, wherein the physical pressure is less than about 1 GPa.

19. A method of forming an altered device, the method comprising:
    effecting application of a physical pressure to a base device having an insulator layer, the base device having a resting electric state that is a base resting electric state,
    the physical pressure being such that the base device is deformed within the base device's elastic limit,
    the physical pressure being applied so as to change the resting electric state of the base device from the base resting electric state to an altered resting electric state and so as to give rise to the altered device, wherein the physical pressure is applied so as to lower the amount of trapped charge of the base device.

20. The method of claim 19, wherein the base device comprises an electrode in electronic communication with the insulator layer.

21. A method of forming an altered device, the method comprising:

effecting application of a physical pressure to a base device having an insulator layer, the base device having a resting electric state that is a base resting electric state, the physical pressure being such that the base device is deformed within the base device's elastic limit, the physical pressure being applied so as to change the resting electric state of the base device from the base resting electric state to an altered resting electric state and so as to give rise to the altered device, wherein the base device is a memory device.

22. A method of forming an altered device, the method comprising:

effecting application of a physical pressure to a base device having an insulator layer, the base device having a resting electric state that is a base resting electric state, the physical pressure being such that the base device is deformed within the base device's elastic limit, the physical pressure being applied so as to change the resting electric state of the base device from the base resting electric state to an altered resting electric state and so as to give rise to the altered device, wherein the insulator layer has a thickness in the range of from about 1 nm to about 100 nm.

23. The method of claim 22, wherein the base device further comprises a second insulating layer, a conductor or semiconductor layer, or both, contacting the insulator layer.

24. The method of claim 23, wherein the second insulator layer, a conductor or semiconductor layer, or both, has a thickness in the range of at least about 0.5 nm.

25. A method of forming an altered device, the method comprising:

effecting application of a physical pressure to a base device having an insulator layer, the base device having a resting electric state that is a base resting electric state, the physical pressure being such that the base device is deformed within the base device's elastic limit, the physical pressure being applied so as to change the resting electric state of the base device from the base resting electric state to an altered resting electric state and so as to give rise to the altered device, wherein the altered device, following the physical pressure application, is capable of maintaining for about 10 minutes an electric value within about 10% of a resting electric value of the device following the physical pressure application.

* * * * *

UNITED STATES PATENT AND TRADEMARK OFFICE
CERTIFICATE OF CORRECTION

PATENT NO. : 10,224,481 B2
APPLICATION NO. : 14/507977
DATED : March 5, 2019
INVENTOR(S) : Chen et al.

Page 1 of 1

It is certified that error appears in the above-identified patent and that said Letters Patent is hereby corrected as shown below:

In the Specification

In Column 9 Line 59: Replace "pressure forming" with --pressure forming.--.

In Column 11 Line 11: Replace "electrical forming" with --electrical forming.--.

Signed and Sealed this
Twentieth Day of August, 2019

Andrei Iancu
*Director of the United States Patent and Trademark Office*